(12) United States Patent
Cheng et al.

(10) Patent No.: US 10,332,999 B1
(45) Date of Patent: Jun. 25, 2019

(54) METHOD AND STRUCTURE OF FORMING FIN FIELD-EFFECT TRANSISTOR WITHOUT STRAIN RELAXATION

(71) Applicant: International Business Machines Corporation, Armonk, NY (US)

(72) Inventors: Kangguo Cheng, Schenectady, NY (US); Juntao Li, Cohoes, NY (US); Choonghyun Lee, Rensselaer, NY (US); Peng Xu, Santa Clara, CA (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/916,525

(22) Filed: Mar. 9, 2018

(51) Int. Cl.
| *H01L 27/088* | (2006.01) |
| *H01L 29/78* | (2006.01) |
| *H01L 29/161* | (2006.01) |
| *H01L 29/10* | (2006.01) |
| *H01L 29/06* | (2006.01) |
| *H01L 29/66* | (2006.01) |
| *H01L 21/02* | (2006.01) |
| *H01L 21/762* | (2006.01) |
| *H01L 29/08* | (2006.01) |

(52) U.S. Cl.
CPC ...... *H01L 29/785* (2013.01); *H01L 21/02271* (2013.01); *H01L 21/762* (2013.01); *H01L 27/0886* (2013.01); *H01L 29/0649* (2013.01); *H01L 29/0847* (2013.01); *H01L 29/1029* (2013.01); *H01L 29/161* (2013.01); *H01L 29/66545* (2013.01); *H01L 29/66795* (2013.01); *H01L 29/7843* (2013.01); *H01L 29/7848* (2013.01)

(58) Field of Classification Search
USPC ............. 257/401, 288, 18, 19; 438/283, 154
See application file for complete search history.

(56) References Cited

U.S. PATENT DOCUMENTS

| 7,915,685 | B2 | 3/2011 | Cohen |
| 9,184,294 | B2 | 11/2015 | Cea et al. |
| 9,548,361 | B1 | 1/2017 | Loubet et al. |
| 9,647,112 | B1* | 5/2017 | Balakrishnan ...... H01L 29/7845 |
| 9,773,871 | B2* | 9/2017 | Chang .................. H01L 29/785 |
| 9,773,875 | B1 | 9/2017 | Jagannathan et al. |
| 2014/0054546 | A1* | 2/2014 | Liu ......................... H01L 21/84 257/24 |
| 2016/0197004 | A1* | 7/2016 | Akarvardar ....... H01L 21/76202 257/509 |

(Continued)

*Primary Examiner* — Niki H Nguyen
(74) *Attorney, Agent, or Firm* — Vazken Alexanian; Ryan, Mason & Lewis, LLP

(57) ABSTRACT

A method for manufacturing a semiconductor device includes patterning a strained semiconductor layer on a substrate into at least one strained fin, forming a plurality of dummy gates spaced apart from each other on the at least one strained fin, forming a spacer layer on the plurality of dummy gates, and on part of the at least one strained fin between the plurality of dummy gates, growing a plurality of source/drain regions on exposed portions of the at least one strained fin, removing the spacer layer from the part of the at least one strained fin between the plurality of dummy gates, and converting the part of the at least one strained fin between the plurality of dummy gates into at least one oxide.

20 Claims, 11 Drawing Sheets

(56) References Cited

U.S. PATENT DOCUMENTS

2016/0204260 A1* 7/2016 Ching ................. H01L 29/7851
                                                    257/401
2016/0225676 A1* 8/2016 Jacob ................... H01L 21/845
2016/0308032 A1* 10/2016 Glass ............... H01L 29/66795

* cited by examiner

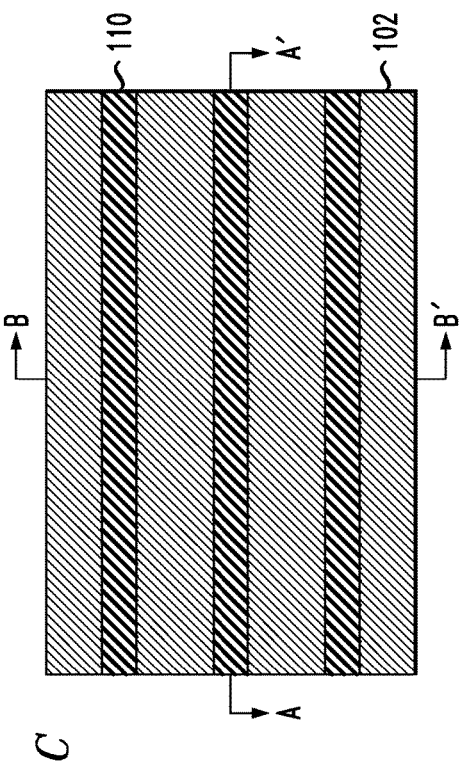
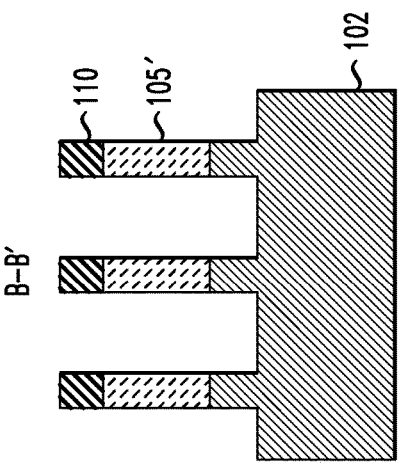
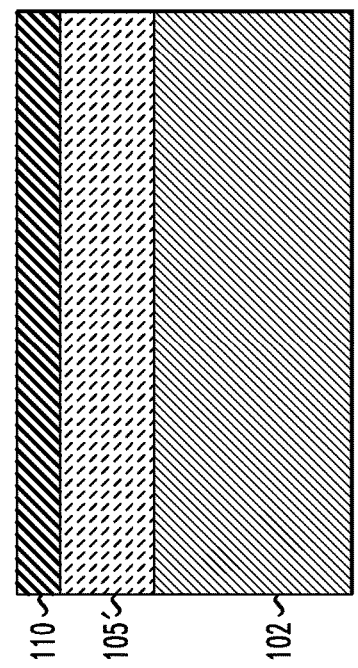
FIG. 2C
FIG. 2B
FIG. 2A

B-B'

A-A'

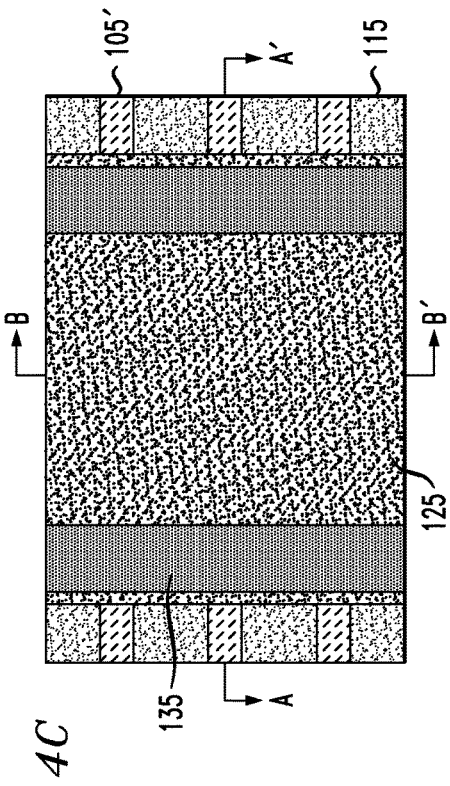
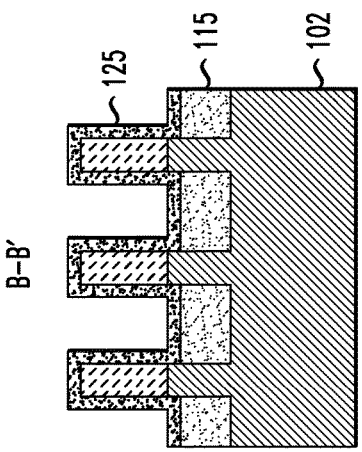
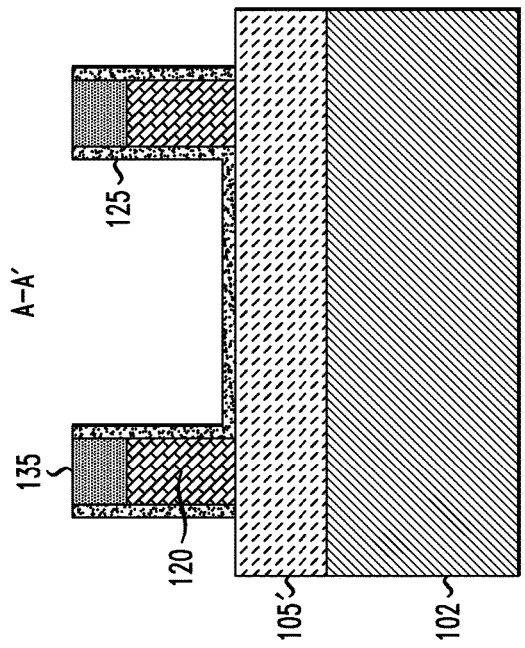
FIG. 4C
FIG. 4B
FIG. 4A

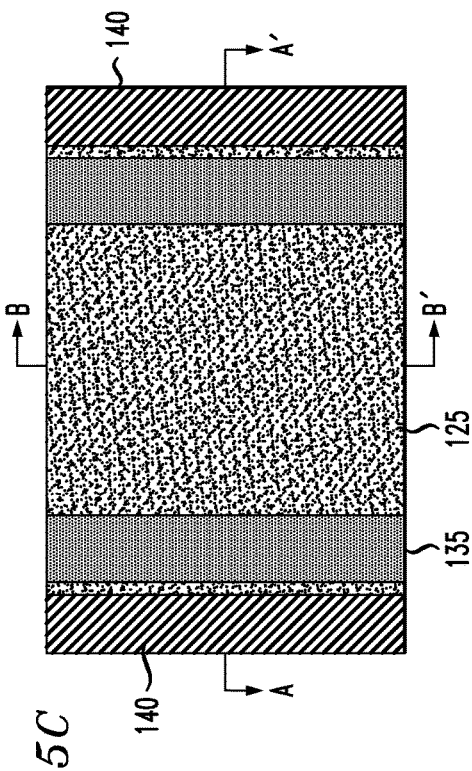
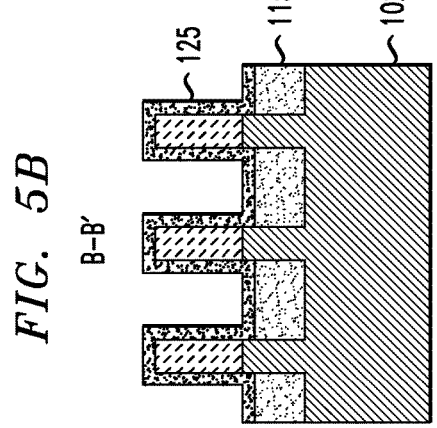
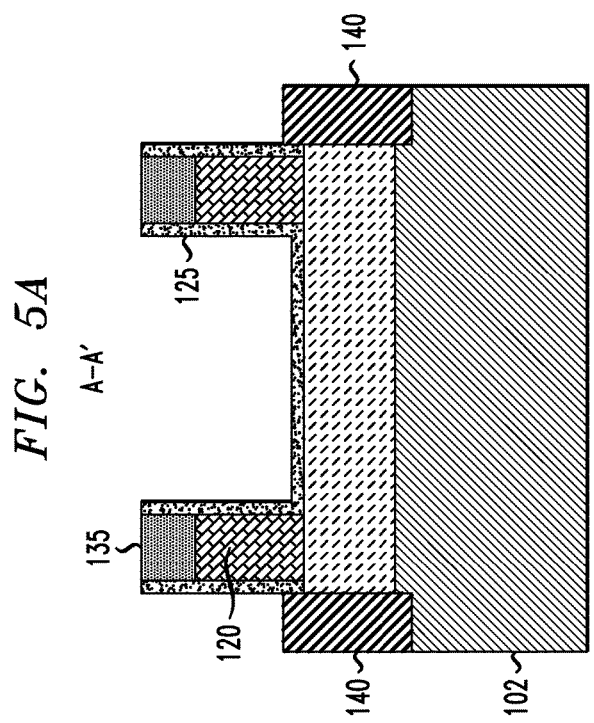
FIG. 5C
FIG. 5B
FIG. 5A

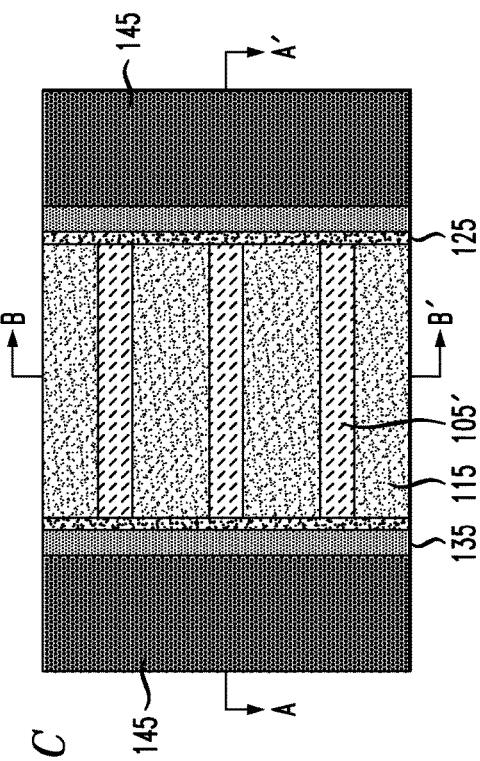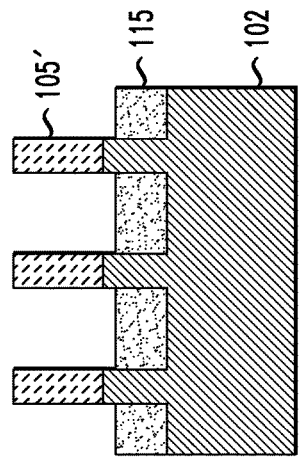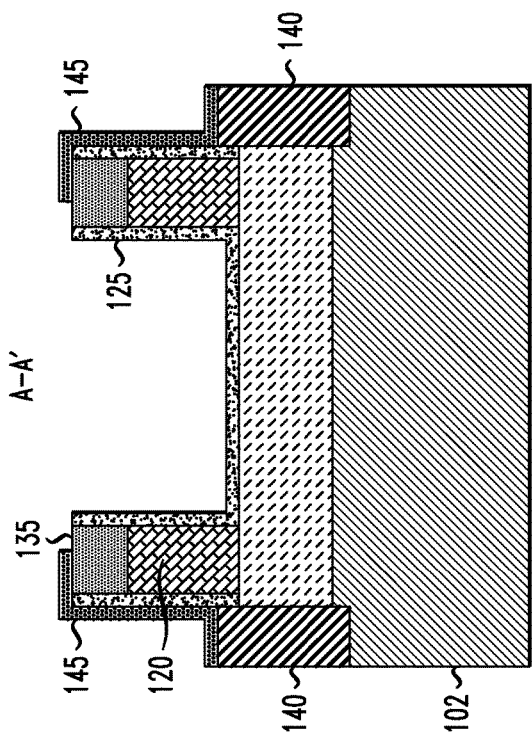
FIG. 6C
FIG. 6B
B-B'
FIG. 6A
A-A'

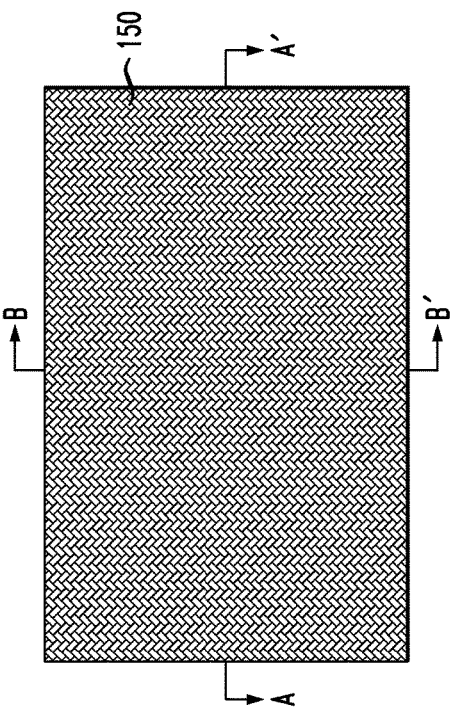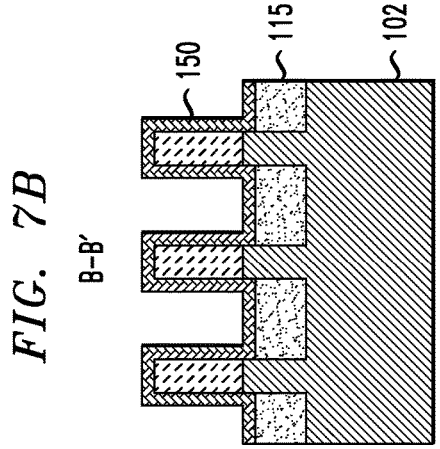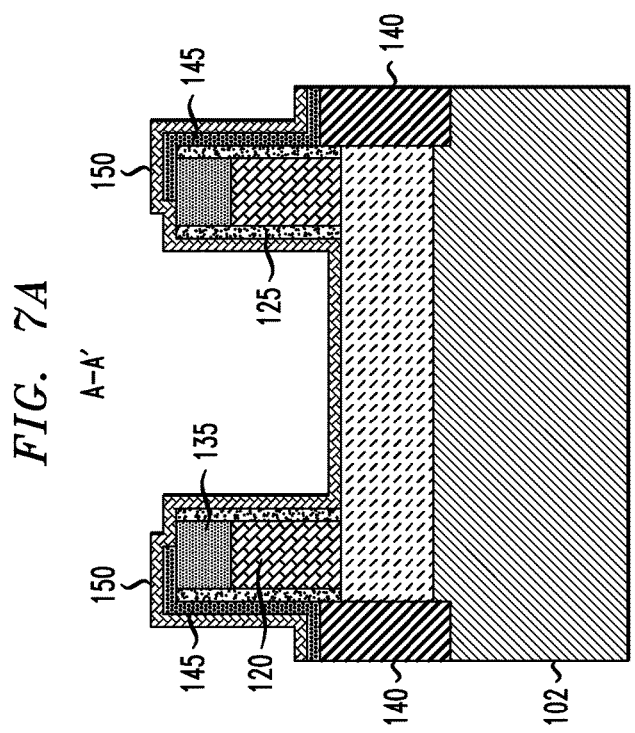

B-B'

A-A'

B-B'

A-A'

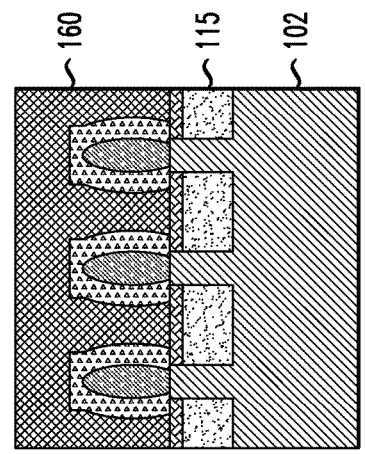
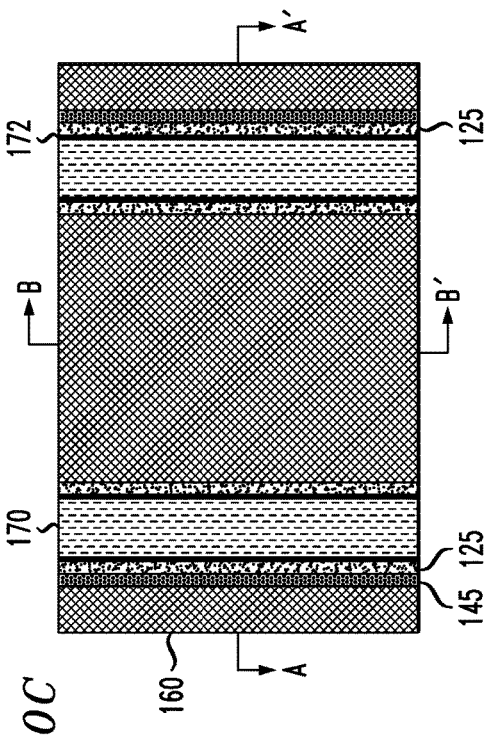
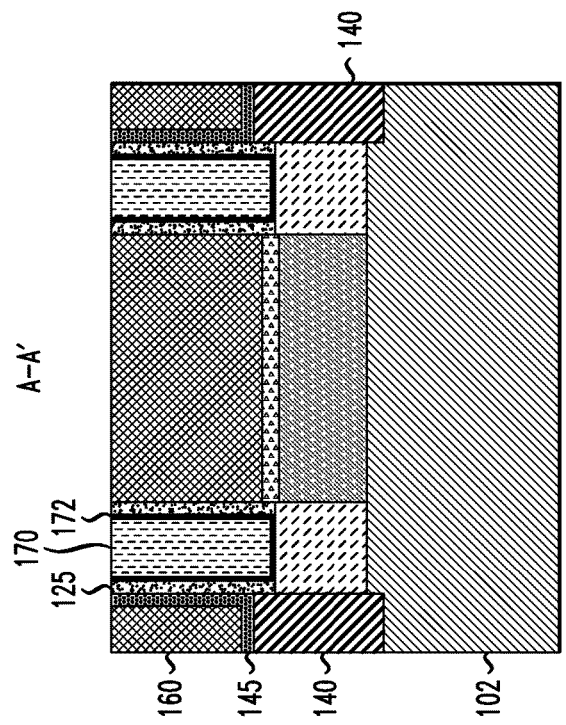
FIG. 10C
FIG. 10B
FIG. 10A

METHOD AND STRUCTURE OF FORMING FIN FIELD-EFFECT TRANSISTOR WITHOUT STRAIN RELAXATION

TECHNICAL FIELD

The field generally relates to semiconductor devices and methods of manufacturing same and, in particular, to forming strained channel regions without strain relaxation at edges thereof.

BACKGROUND

Strain engineering can result in increased performance in semiconductor devices, such as, for example, complementary metal-oxide semiconductor (CMOS) devices. Tensile strain is beneficial for n-type field-effect transistors (NFETs) and compressive strain is beneficial for p-type field-effect transistors (PFETs).

However, when silicon germanium (SiGe) or silicon (Si) fins are physically cut into desired lengths to meet design requirements, strain relaxes at fin ends near where cuts are made. The edge relaxation reduces the benefits provided by strain and causes device degradation and variation.

Accordingly, there is a need for preserving strain in semiconductor devices, such as fin field-effect transistor (FinFET) devices.

SUMMARY

According to an exemplary embodiment of the present invention, a method for manufacturing a semiconductor device includes patterning a strained semiconductor layer on a substrate into at least one strained fin, forming a plurality of dummy gates spaced apart from each other on the at least one strained fin, forming a spacer layer on the plurality of dummy gates, and on part of the at least one strained fin between the plurality of dummy gates, growing a plurality of source/drain regions on exposed portions of the at least one strained fin, removing the spacer layer from the part of the at least one strained fin between the plurality of dummy gates, and converting the part of the at least one strained fin between the plurality of dummy gates into at least one oxide.

According to an exemplary embodiment of the present invention, a semiconductor device includes at least one strained fin formed on a semiconductor substrate, a plurality of gate regions formed on the at least one strained fin, and an isolation region on the semiconductor substrate adjacent the at least one strained fin, wherein the isolation region comprises an outer portion comprising silicon oxide and an inner portion comprising silicon germanium oxide.

According to an exemplary embodiment of the present invention, a method for manufacturing a semiconductor device includes patterning a strained semiconductor layer on a substrate into at least one strained fin, forming a spacer layer on part of the at least one strained fin, growing a plurality of source/drain regions on exposed portions of the at least one strained fin, removing the spacer layer from the part of the at least one strained fin, and converting the part of the at least one strained fin into at least one oxide.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 2A and 2B are cross-sectional views and FIG. 2C is top view illustrating formation of hardmask pattern on and removal of portions of the compressively strained semiconductor layer to form a plurality of fins in a method of manufacturing a semiconductor device, according to an exemplary embodiment of the present invention.

FIGS. 4A and 4B are cross-sectional views and FIG. 4C is top view illustrating dummy gate and spacer formation in a method of manufacturing a semiconductor device, according to an exemplary embodiment of the present invention.

FIGS. 5A and 5B are cross-sectional views and FIG. 5C is top view illustrating growth of source/drain regions, according to an exemplary embodiment of the present invention.

FIGS. 6A and 6B are cross-sectional views and FIG. 6C is top view illustrating inter-level dielectric (ILD) liner deposition and removal in a fin cut region, according to an exemplary embodiment of the present invention.

FIGS. 7A and 7B are cross-sectional views and FIG. 7C is top view illustrating germanium oxide deposition, according to an exemplary embodiment of the present invention.

FIGS. 10A and 10B are cross-sectional views and FIG. 10C is top view illustrating removal of unreacted germanium oxide, deposition of an ILD layer and replacement metal gate (RMG) processing, according to an exemplary embodiment of the present invention.

DETAILED DESCRIPTION

Figure 1:
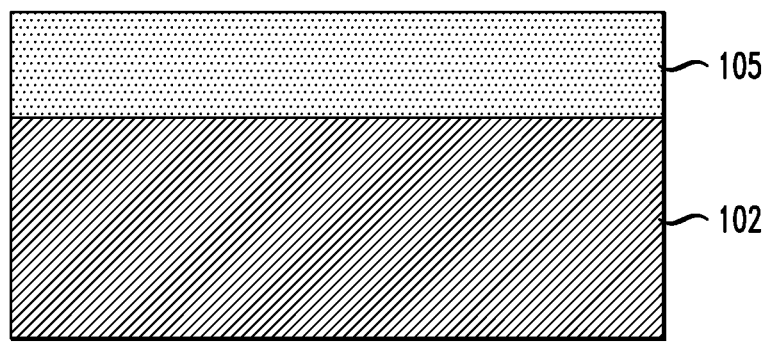
FIG. 1 is a cross-sectional view illustrating growth of a compressively strained semiconductor layer on a substrate in a method of manufacturing a semiconductor device, according to an exemplary embodiment of the present invention.

Exemplary embodiments of the invention will now be discussed in further detail with regard to semiconductor devices and methods of manufacturing same and, in particular, to forming strained fins without strain relaxation of fin edges adjacent an isolation region.

It is to be understood that the various layers and/or regions shown in the accompanying drawings are not drawn to scale, and that one or more layers and/or regions of a type commonly used in, for example, a complementary metal-oxide semiconductor (CMOS), field-effect transistor (FET), nanowire FET, fin field-effect transistor (FinFET), metal-oxide-semiconductor field-effect transistor (MOSFET), vertical FET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, nanowire FETs, nanosheet FETs, vertical FETs, SETs, CMOSs and/or MOSFETs. By way of non-limiting example, the semiconductor devices can include, but are not necessarily limited to FET, FinFET, nanowire FET, nanosheet FET, vertical FET, SET, CMOS and MOSFET devices, and/or semiconductor devices that use FET, FinFET, nanowire FET, nanosheet FET, vertical FET, SET CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "compressive strain" or "compressively strained" refers to a strain in inner lateral directions (e.g. pushing in inward directions) in a semiconductor layer epitaxially grown on an underlying layer, which is caused by the in-plane lattice constant of the grown layer being larger than the in-plane lattice constant of the underlying layer. As a result of the lattice mismatch, the larger lattice constant of the grown layer is pushed in inward lateral directions to link or align with the smaller lattice constant of the underlying layer. In a non-limiting example, an underlying layer of silicon, which has a smaller in-plane lattice constant than silicon germanium when both silicon and silicon germanium are relaxed, will cause epitaxially grown silicon germanium to experience compressive strain, or be compressively strained.

As used herein, "tensile strain" or "tensile strained" refers to a strain in outer lateral directions (e.g. pulling in outward directions) in a semiconductor layer epitaxially grown on an underlying layer, which is caused by the in-plane lattice constant of the grown layer being smaller than the in-plane lattice constant of the underlying layer. As a result of the lattice mismatch, the smaller lattice constant of the grown layer are pulled in outward lateral directions to link or align with the larger lattice constant of the underlying layer. In a non-limiting example, an underlying layer of silicon germanium, which has a larger in-plane lattice constant than silicon when both silicon and silicon germanium are relaxed, will cause epitaxially grown silicon to experience tensile strain, or be tensile strained.

FinFET devices include a transistor architecture that uses raised source-to-drain channel regions, referred to as fins. A FinFET device can be built on a semiconductor substrate, where a semiconductor material, such as Si and/or SiGe, is patterned into fin-like shapes and functions as the channels of the transistors. Some FinFET devices include fins with source/drain regions on lateral sides of the fins, so that current flows in a horizontal direction (e.g., parallel to a substrate) between source/drain regions at opposite ends of the fins in the horizontal direction.

FIG. 1 is a cross-sectional view illustrating growth of a compressively strained semiconductor layer on a substrate in a method of manufacturing a semiconductor device, according to an exemplary embodiment of the present invention. Referring to FIG. 1, a compressively strained semiconductor layer 105 is epitaxially grown on a semiconductor substrate 102. In accordance with an embodiment of the present invention, the substrate 102 comprises, a semiconductor material including, but not necessarily limited to, silicon (Si), silicon carbide (SiC), Si:C (carbon doped silicon), II-V, III-V compound semiconductor or other like semiconductor. In addition, multiple layers of the semiconductor materials can be used as the semiconductor material of the substrate. In accordance with an embodiment of the present invention, the compressively strained semiconductor layer 105 comprises a semiconductor material including, but not necessarily limited to, silicon germanium (SiGe) or other semiconductor material, which would be compressively strained after epitaxial growth due to mismatched lattice structures with the crystal structure of the material of the underlying substrate 102. For example, the material of the semiconductor layer can be SiGe having 25% germanium, but the embodiments of the present invention are not limited thereto. Another possible material for the compressively strained layer may include germanium or any other material as long as the epitaxy material and the substrate material have different lattice constants from each other when they are relaxed. In accordance with an embodiment of the present invention, a resulting vertical height (e.g., thickness) of the semiconductor layer 105 after epitaxial growth is about 5 nm to about 100 nm.

In some embodiments, the compressively strained semiconductor layer 105 (e.g., SiGe) is grown only a PFET region, which benefits from compressive strain, while maintaining a material of the substrate 102 (e.g., Si) in an NFET region. This can be accomplished by using a mask to cover the NFET region, recessing Si in the PFET region, and then growing back SiGe in the recess to form a compressively strained semiconductor in a PFET region.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a $\{100\}$ crystal surface will take on a $\{100\}$ orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 550° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

FIGS. 2A and 2B are cross-sectional views and FIG. 2C is top view illustrating formation of hardmask pattern on and removal of portions of the compressively strained semiconductor layer to form a plurality of fins in a method of manufacturing a semiconductor device, according to an exemplary embodiment of the present invention. The cross-sections in the figures labeled A and B herein are respectively taken along lines A-A' and B-B' of the top views labeled C.

Fins, such as fins 105', can be formed by patterning a compressively strained semiconductor layer 105 into the fins 105'. According to an embodiment, a hardmasks 110 of the hardmask pattern include, for example, a dielectric material, such as silicon nitride (SiN) formed on portions of the semiconductor layer 105 that are to be formed into the fins 105'. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hardmasks 110 to form the fins by RIE processes. While embodiments of the present invention describe channel regions as fins, the embodiments are not necessarily limited to fin channel regions, and may include nanowire channel regions. In addition, although three fins 105' are shown in the figures for ease of explanation, more or less than three fins can be formed. As can be seen in FIG. 2B, portions of the substrate 102 are also removed during fin formation to form recessed portions of the substrate 102 where isolation regions are to be formed.

Figure 3C:
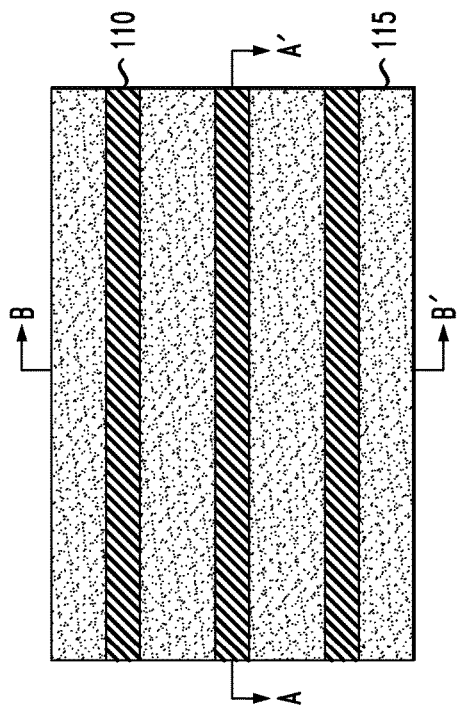
FIGS. 3A and 3B are cross-sectional views and FIG. 3C is top view illustrating formation of isolation regions between fins in a method of manufacturing a semiconductor device, according to an exemplary embodiment of the present invention.
Figure 3B:
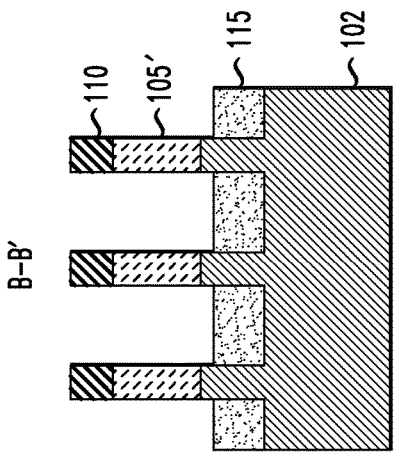
Figure 3A:
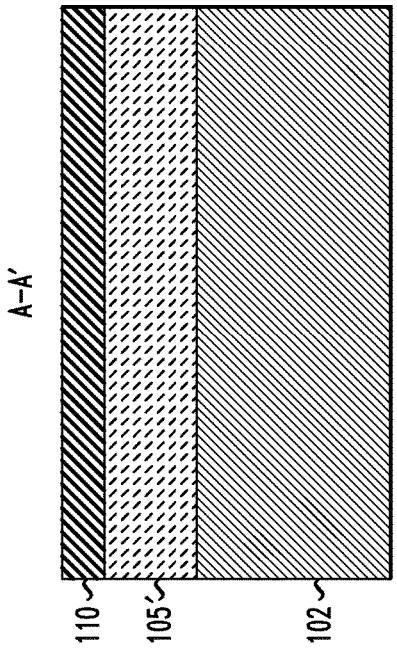

FIGS. 3A and 3B are cross-sectional views and FIG. 3C is top view illustrating formation of isolation regions between fins in a method of manufacturing a semiconductor device, according to an exemplary embodiment of the present invention. Referring to FIGS. 3A-3C, a dielectric material layer 115, including, but not necessarily limited to silicon oxide, silicon nitride, silicon oxycarbide (SiOC), silicon oxycarbonitride (SiOCN) or some other dielectric, or any suitable combination of those materials, is formed on substrate 102 around the fins 105'. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process down to the hardmasks 110, such as, chemical mechanical planarization (CMP) to remove excess dielectric material. Then, the dielectric layer 115 is recessed as shown in FIG. 3B to a height below the fins 105' at or near a top of the recessed portions of the substrate 102 to form the isolation regions (e.g., shallow trench isolation (STI) regions).

FIGS. 4A and 4B are cross-sectional views and FIG. 4C is top view illustrating dummy gate and spacer formation in a method of manufacturing a semiconductor device, according to an exemplary embodiment of the present invention.

Referring to FIGS. 4A-4C, a dummy gate layer is formed on the fins 105' and patterned into dummy gates 120 including, but not necessarily limited to, amorphous silicon or a dummy gate oxide. The dummy gate layer is deposited using deposition techniques such as, for example, CVD, PECVD, RFCVD, PVD, ALD, MBD, PLD, and/or LSMCD. A cap layer 135 is formed on top of each of the dummy gates 120 by one or more of the deposition techniques noted in connection with deposition of the dummy gate layer. The cap material can comprise but is not necessarily limited to, silicon nitride, silicon oxynitride, boron nitride, silicon boron nitride, or multilayered stacks thereof.

The spacer layer 125 can comprise, for example, silicon nitride (SiN), boron nitride (BN), silicon boron nitride (SiBN), silicon carbon nitride (SiCN), silicon oxynitride (SiON) and/or silicon-oxygen-carbon-nitride (SiOCN), and may be formed by any suitable deposition technique known in the art, including, but not limited to, by one or more of the deposition techniques noted above. A deposited spacer layer can be patterned by, for example, an isotropic etching process, such as reactive ion etching (RIE), to form the spacers 125 along sides of dummy gates 120 and the cap layers 135, and on the fins 105' between the dummy gates 120. Referring to FIGS. 4A and 4C, parts of the spacer layer 125 (e.g., horizontal parts) are removed from portions of the fins 105' where source/drain regions will be epitaxially grown as described further herein below. The spacer layers 125 on the fins 105' between the dummy gates 120 are not removed, and prevent epitaxial growth of source/drain regions in the regions covered by the spacer layers 125. In accordance with an embodiment of the present invention, removal of the spacer layer 125 between the dummy gates 120 is prevented with a mask (not shown) used during etching covering the region between the dummy gates 120.

FIGS. 5A and 5B are cross-sectional views and FIG. 5C is top view illustrating growth of source/drain regions, according to an exemplary embodiment of the present invention. Referring to FIGS. 5A-5C, source/drain regions 140 can be formed by an epitaxial growth process, wherein the source/drain regions 140 are grown on the exposed portions of the fins 105'. The epitaxially grown source/drain regions 140 can be doped using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be 1e18/cm$^3$ to 3e21/cm$^3$. As noted herein above, the spacer layer 125 on the fins 105' between the dummy gates 120 prevents epitaxial growth of source/drain regions in those regions covered by the spacer layer 125.

FIGS. 6A and 6B are cross-sectional views and FIG. 6C is top view illustrating inter-level dielectric (ILD) liner deposition and removal in a fin cut region, according to an exemplary embodiment of the present invention. Referring to FIGS. 6A-6C, ILD liner layers 145 including, but not necessarily limited to, a nitride, are deposited on the source/drain regions 140 and portions of the spacer layers 125 and cap layers 135 on the dummy gates 120. The liner layers 145 can be deposited by one or more of the deposition techniques noted herein above. As can be seen, the ILD liner layers 145 cover part of a top surface of the cap layers 135. A mask (not shown) is used to expose portions of the ILD liner layer 145 in a fin cut region to remove the ILD liner layers 145 and underlying spacer layers 125 from the fin cut region, which leaves portions of the fins between the dummy gates 120 exposed.

FIGS. 7A and 7B are cross-sectional views and FIG. 7C is top view illustrating germanium oxide deposition, according to an exemplary embodiment of the present invention. Referring to FIGS. 7A-7C, a germanium oxide (GeO$_2$) layer 150 is deposited using, for example, ALD or other conformal deposition process, on the structure from FIGS. 6A-6C, including on the ILD liner layers 145, the source/drain regions 140, the dummy gates 120, cap layers 135, the spacer layers 125 and the exposed portions of the fins 105'. In a non-limiting embodiment, a thickness of the GeO$_2$ layer 150 can be in the range of 5 nm to 10 nm.

Figure 8C:
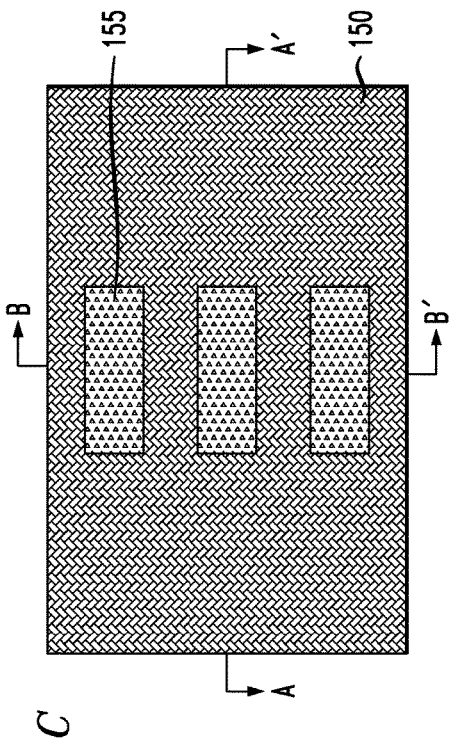
FIGS. 8A and 8B are cross-sectional views and FIG. 8C is top view illustrating a structure after an annealing process, according to an exemplary embodiment of the present invention.
Figure 8B:
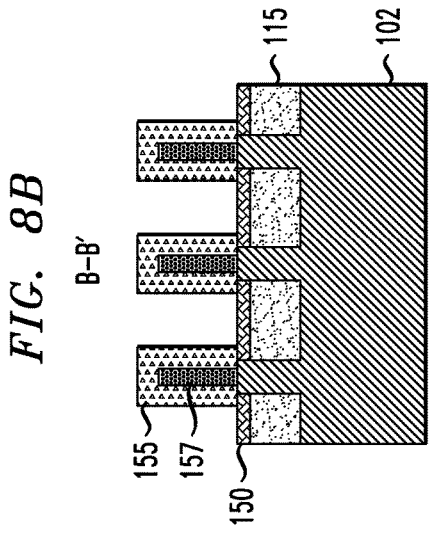
Figure 8A:
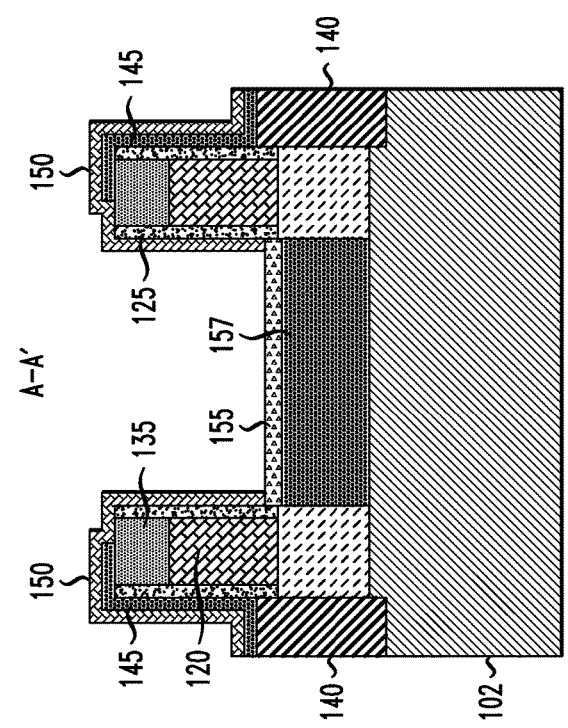

FIGS. 8A and 8B are cross-sectional views and FIG. 8C is top view illustrating a structure after an annealing process, according to an exemplary embodiment of the present invention. Referring to FIGS. 8A-8C, a low temperature anneal process, such as, for example, a spike annealing process using nitrogen at about 500° C., is performed. As shown in FIGS. 8A-8C, the annealing process converts the GeO$_2$ layer 150 on the fins 105', part of the silicon germanium fins 105' into silicon oxide 150, and a remaining portion of the SiGe fins 105' at the center of the fins 105' into a SiGe core 157 with a higher Ge percent concentration (%) than that of the original SiGe fins 105'. For example, for a SiGe fin 105' having 25% Ge and a 6 nm fin width, 2 nm SiGe is consumed on each side of the fin to form silicon oxide 155, leaving a 2 nm wide SiGe core 157 with a Ge % of approximately 75%-80%. An unreacted portion of the GeO$_2$ layer 150 remains on the isolation regions 115 and on portions of the dummy gates 120 including the ILD liner, cap and spacer layers 145, 135 and 125 thereon, and on the source/drain regions 140 including the ILD liner layers 145 thereon. The silicon oxide 150 includes, but is not necessarily limited to, silicon dioxide (SiO$_2$) or SiO$_x$, where x is for example, 1.99 or 2.01.

According to an embodiment of the present invention, during the low temperature annealing process, the annealing conditions cause the Si in the SiGe fin 105' to bond with the oxygen in the GeO$_2$ layer 150 to form silicon oxide portions 155. The Si in the SiGe fin does not bond with the Ge in the GeO$_2$ layer 150. As a result, the Ge from the GeO$_2$ layer 150 is driven into the inner portions of the fins 105' and the Si from the inner portions of the fins 105' is driven out of the fins 105' to bond with the oxygen, which forms the high Ge % SiGe core portions 157. The resulting Ge concentration in the high Ge % SiGe portions 157 is higher than the Ge concentration in the original fins 105'. In accordance with an embodiment of the present invention, the percentage (i.e., concentration) of Ge in the high Ge % SiGe core portions 157 is in the range of about atomic 70%-about atomic 90%. As discussed in connection with FIGS. 9A-9C, the higher percentage of Ge in the SiGe core portions 157 enables the core portions 157 to be oxidized at a relatively low temperature (e.g., below about 500° C.). Low temperature is critical after the formation of source/drain because low thermal budget minimizes the undesired dopant diffusion from source/drain to the channel. Excessive dopant diffusion will reduce the sharpness of pn junctions and thus degrade device performance.

In accordance with embodiments of the present invention, the annealing can be performed at a temperature range of about 350° C.-about 700° C., in an environment including nitrogen, argon, xenon, helium, hydrogen, or any suitable combination of those gases, for a time period 1 millisecond to 30 minutes. The anneal can be done by rapid thermal annealing (RTP), furnace annealing, flash annealing, laser annealing, spike annealing, or any suitable combination of those techniques.

In accordance with an embodiment of the present invention, the annealing may be carried out for a variable period of time. In one example, the annealing process is carried out for a time period from about 0.5 seconds to 2 seconds, depending on temperature and germanium concentration in the SiGe fins 105'. The annealing process may be carried out at a single targeted temperature, or at various ramp and soak cycles using various ramp rates and soak times.

By way of further explanation, in accordance with an embodiment of the present invention, the Si atoms in the SiGe fins 105' bond with available oxygen from the $GeO_2$ layer 150 during the annealing process to form silicon oxide portions 155. The high Ge % SiGe core portions 157 are formed due to the lower Si concentration and higher Ge concentration caused by the consumption of silicon and influx of germanium into the high Ge % SiGe portions 157.

Figure 9C:
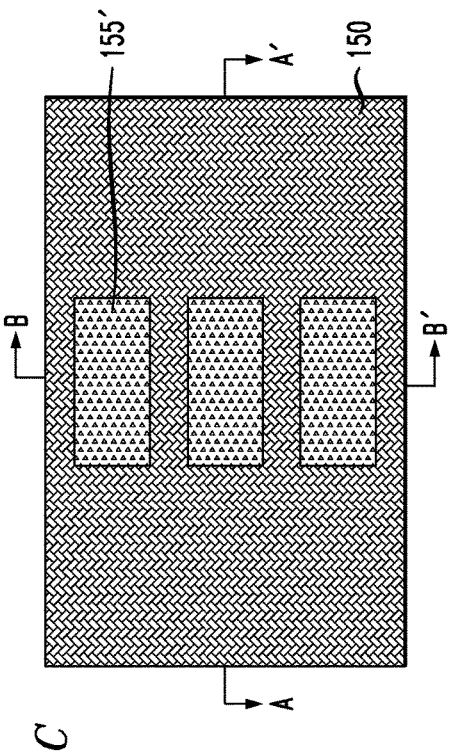
FIGS. 9A and 9B are cross-sectional views and FIG. 9C is top view illustrating a structure after a further annealing process, according to an exemplary embodiment of the present invention.
Figure 9B:
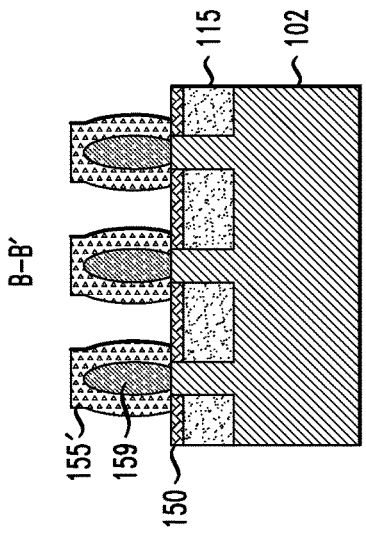
Figure 9A:
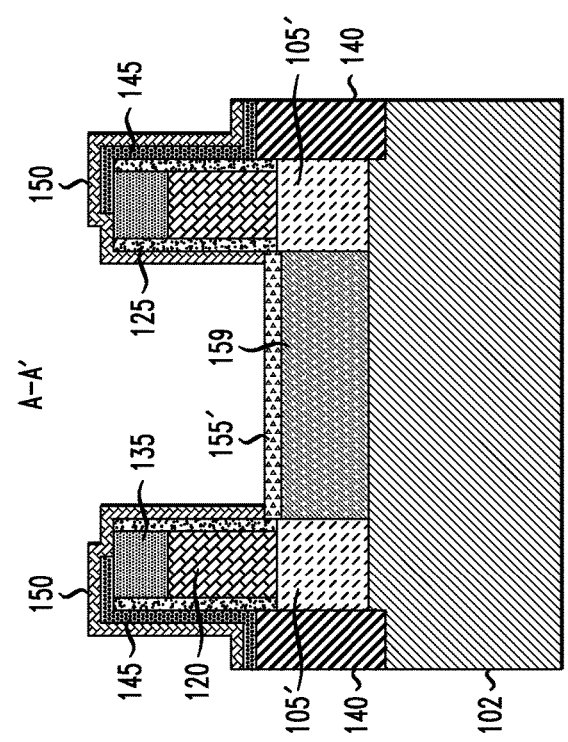

FIGS. 9A and 9B are cross-sectional views and FIG. 9C is top view illustrating a structure after a further annealing process, according to an exemplary embodiment of the present invention. Referring to FIGS. 9A-9C, a low temperature anneal process, such as, for example, an annealing process using oxygen at about 400° C., is performed to completely oxidize the SiGe core portions 157, converting them to $SiGeO_x$ portions 159. As a result, the entire fin cut region has been converted into oxide portions (e.g., silicon oxide portions 155 and $SiGeO_x$ portions 159 without performing any physical cutting of the fins, thereby preventing edge relaxations that would have been caused by physical cutting. In other words, strain (e.g., compressive strain) is maintained in the remaining fin portions 105' that form the channel regions of resulting transistors without relaxed portions at the edges of the remaining fin portions 105'. In accordance with an embodiment of the present invention, the annealing can be performed at temperatures below 500° C., and in an oxidation ambient. For example, the oxidation can be performed by a wet oxidation (meaning oxidation by water vapor in the oxidation chamber). As noted above in connection with FIGS. 8A-8C, the higher percentage of Ge in the SiGe core portions 157 enables the core portions 157 to be completely oxidized at a relatively low temperature (e.g., below about 500° C.), which can prevent germanium diffusion into adjacent fins 105' that could occur when oxidation must be performed at relatively higher temperatures (e.g., above about 500° C.).

The width increase between silicon oxide portions 155 and 155' and between SiGe core portions 157 and $SiGeO_x$ portions 159 is due to the volume expansion caused by the thermal oxidation process. This expansion occurs when SiGe core portions 157 are being oxidized.

FIGS. 10A and 10B are cross-sectional views and FIG. 10C is top view illustrating removal of unreacted germanium oxide, deposition of an ILD layer and replacement metal gate (RMG) processing, according to an exemplary embodiment of the present invention. Referring to FIGS. 10A-10C, the unreacted $GeO_2$ layer 150 on the isolation regions 115 is water soluble, and is removed using, for example, a water based agent, such as, for example, deionized water (DI water). The unreacted portions of the $GeO_2$ layer 150 are removed from the isolation regions 115, portions of the dummy gates 120 including the ILD liner, cap and spacer layers 145, 135 and 125 thereon, and from the source/drain regions 140 including the ILD liner layers 145 thereon. Then, an inter-level dielectric (ILD) layer 160 comprising, for example, silicon oxide ($SiO_2$), silicon oxycarbide (SiOC), silicon oxycarbonitride (SiOCN) or some other dielectric is formed on the exposed portions of the structure after removal of the unreacted portions of the $GeO_2$ layer 150. In some embodiments, a liner material (e.g., silicon nitride, not shown) can be deposited before the deposition of the ILD layer 160. The ILD layer 160 is deposited using a deposition process, such as, for example, CVD, PECVD, PVD, ALD, MBD, PLD, LSMCD, and/or spin-on coating. The deposited layer is planarized down to the cap layers 135 using a planarization process, such as, for example, CMP.

Then a replacement metal gate (RMG) process is performed to remove the cap layers 135 and dummy gates 120, and to form high-k dielectric layers 172 and gate layers 170 in place of the cap layers 135 and dummy gates 120. The high-K dielectric layers 172 include, but are not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other dielectric. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate layers 170 can include, for example, a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate layers 170 may further include, but are not necessarily limited to, metals, such as, for example, tungsten, cobalt, zirconium, tantalum, titanium, aluminum, ruthenium, and/or copper, metal carbides, metal nitrides, transition metal aluminides, tantalum carbide, titanium carbide, tantalum magnesium carbide, or combinations thereof deposited on the WFM layer. The high-k dielectric and gate layers 172 and 170 are formed on the strained fins 105' between the spacer layers 125 in the area previously occupied by the cap and dummy gate layers 135 and 120.

Figure 11:
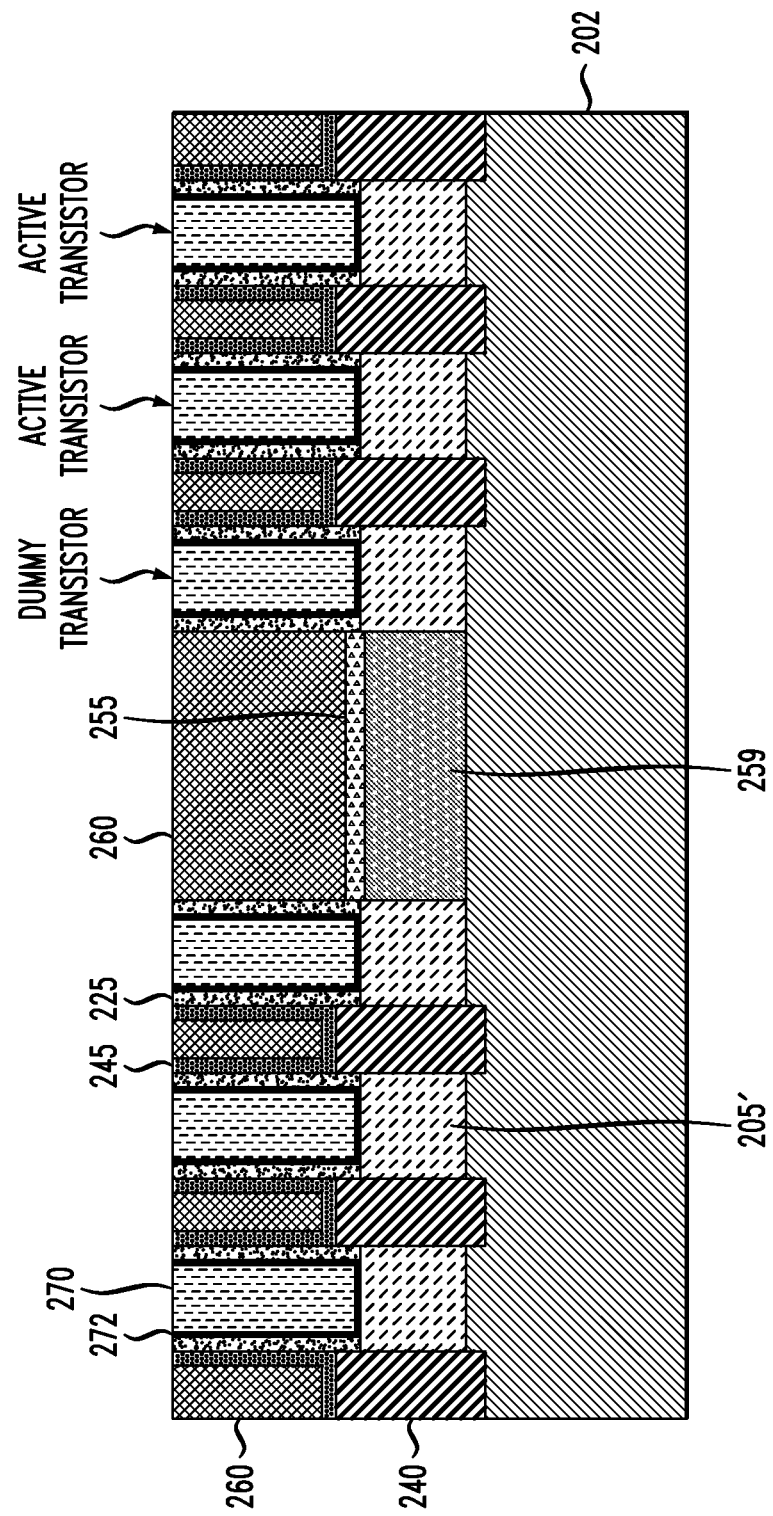
FIG. 11 is a cross-sectional view illustrating a fin field-effect transistor (FinFET) device, according to an exemplary embodiment of the present invention.

FIG. 11 is a cross-sectional view illustrating a fin field-effect transistor (FinFET) device, according to an exemplary embodiment of the present invention. Referring to FIG. 11, a semiconductor device manufactured in accordance with embodiments of the present invention is shown. The device includes a semiconductor substrate 202 (e.g., silicon) including a plurality of gate regions including gate and dielectric layers 270 and 272 on corresponding channel regions. The channel regions comprise compressively strained SiGe fins 205. The gate regions are bordered by spacers 225 and are isolated from other gate regions by corresponding ILD layers 260, which in some portions are positioned on respective ILD liner layers 245. Source/drain regions 240 are formed on ends of the compressively strained SiGe fins 205. The device further includes a $SiGeO_x$ layer 259 on the substrate 202, a silicon oxide layer 255 on the $SiGeO_x$ layer 259, and an ILD layer 260 on the silicon oxide layer 255. The silicon oxide layer 255 on the $SiGeO_x$ layer 259, and the ILD layer 260 on the silicon oxide layer 255 form an isolation region, which isolates groups of transistors from each other in what may be a fin cut region. The isolation region comprising the silicon oxide layer 255 on the SiGeO$_x$ layer 259, and the ILD layer 260 on the silicon oxide layer 255 is formed without physically removing fin material (e.g., performing fin cutting), therefore avoiding the strain edge relaxation. Instead, the portion of the SiGe fin in the STI region is exposed after source/drain epitaxial growth and converted into oxides (e.g., silicon oxide layer 255 and SiGeO$_x$ layer 259) by low temperature oxidation processes. This low thermal budget processing prevents drawbacks, such as Ge diffusion, or dopant diffusion, etc., thereby improving device performance. As noted in FIG. 11, in accordance with a non-limiting embodiment of the present invention, active transistors (with active gates) and dummy transistors at the ends of an isolation region can be formed on each side of the isolation region separating groups of transistors.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   patterning a strained semiconductor layer on a substrate into at least one strained fin;
   forming a plurality of dummy gates spaced apart from each other on the at least one strained fin;
   forming a spacer layer on the plurality of dummy gates, and on part of the at least one strained fin between the plurality of dummy gates;
   growing a plurality of source/drain regions on exposed portions of the at least one strained fin;
   removing the spacer layer from the part of the at least one strained fin between the plurality of dummy gates; and
   converting the part of the at least one strained fin between the plurality of dummy gates into at least one oxide.

2. The method according to claim 1, further comprising depositing a germanium oxide layer on the part of the at least one strained fin between the plurality of dummy gates, wherein the at least one strained fin comprises silicon germanium (SiGe).

3. The method according to claim 2, wherein the converting comprises performing an annealing process which converts an outer portion of the at least one strained fin into silicon oxide and an inner portion of the at least one strained fin into a SiGe core portion having a higher concentration of germanium than an initial germanium concentration of the at least one strained fin.

4. The method according to claim 3, wherein the annealing process is performed in at least one of nitrogen, argon, xenon, helium, and hydrogen.

5. The method according to claim 3, wherein the annealing process is performed at a temperature of about 350° C.-about 700° C.

6. The method according to claim 3, wherein the converting further comprises performing an additional annealing process to convert the SiGe core portion to SiGe oxide.

7. The method according to claim 6, wherein the additional annealing process is performed in an oxidation ambient.

8. The method according to claim 7, wherein the additional annealing process is performed at a temperature less than about 500° C.

9. The method according to claim 1, further comprising depositing an inter-level dielectric liner layer on the plurality of source/drain regions and on the plurality of dummy gates.

10. The method according to claim 2, further comprising:
    depositing an inter-level dielectric liner layer on the part of the at least one strained fin between the plurality of dummy gates; and
    removing the inter-level dielectric liner layer from the part of the at least one strained fin between the plurality of dummy gates prior to depositing the germanium oxide layer.

11. The method according to claim 1, wherein the strained semiconductor layer comprises silicon germanium.

12. The method according to claim 1, wherein the at least one strained fin is compressively strained.

13. A semiconductor device, comprising:
    at least one strained fin formed on a semiconductor substrate;
    a plurality of gate regions formed on the at least one strained fin; and
    an isolation region on the semiconductor substrate adjacent the at least one strained fin, wherein the isolation region comprises an outer portion comprising silicon oxide and an inner portion comprising silicon germanium oxide.

14. The semiconductor device according to claim 13, wherein the at least one strained fin is compressively strained without relaxation of strain at an edge of the at least one strained fin adjacent the isolation region.

15. The semiconductor device according to claim 13, wherein the at least one strained fin comprises silicon germanium.

16. The semiconductor device according to claim 13, further comprising a plurality of source/drain regions respectively between adjacent gate regions of the plurality of gate regions.

17. A method for manufacturing a semiconductor device, comprising:
    patterning a strained semiconductor layer on a substrate into at least one strained fin;
    forming a spacer layer on part of the at least one strained fin;
    growing a plurality of source/drain regions on exposed portions of the at least one strained fin;
    removing the spacer layer from the part of the at least one strained fin; and
    converting the part of the at least one strained fin into at least one oxide.

18. The method according to claim 17, further comprising depositing a germanium oxide layer on the part of the at least one strained fin, wherein the at least one strained fin comprises silicon germanium (SiGe).

19. The method according to claim 18, wherein the converting comprises performing an annealing process which converts an outer portion of the at least one strained fin into silicon oxide and an inner portion of the at least one strained fin into a SiGe core portion having a higher concentration of germanium than an initial germanium concentration of the at least one strained fin.

20. The method according to claim 19, wherein the converting further comprises performing an additional annealing process to convert the SiGe core portion to SiGe oxide.

* * * * *